(12) United States Patent
Yang

(10) Patent No.: US 8,312,840 B2
(45) Date of Patent: Nov. 20, 2012

(54) SUBSTRATE PROCESSING APPARATUS AND METHOD

(75) Inventor: Il-Kwang Yang, Yongin-si (KR)

(73) Assignee: Eugene Technology Co., Ltd., Yongin-si (KR)

( * ) Notice: Subject to any disclaimer, the term of this patent is extended or adjusted under 35 U.S.C. 154(b) by 49 days.

(21) Appl. No.: 12/934,385

(22) PCT Filed: Mar. 23, 2009

(86) PCT No.: PCT/KR2009/001464
§ 371 (c)(1),
(2), (4) Date: Sep. 27, 2010

(87) PCT Pub. No.: WO2009/120000
PCT Pub. Date: Oct. 1, 2009

(65) Prior Publication Data
US 2011/0021034 A1    Jan. 27, 2011

(30) Foreign Application Priority Data
Mar. 25, 2008    (KR) ........................ 10-2008-0027506

(51) Int. Cl.
*C23C 16/00* (2006.01)
*C23C 16/50* (2006.01)
(52) U.S. Cl. ..................... 118/723 R; 438/485; 438/513; 438/710; 438/788; 438/792; 257/E21.269
(58) Field of Classification Search ............... 438/5, 11, 438/14, 485, 513, 710, 788, 792; 118/723 E, 118/719; 427/569; 257/E21.269
See application file for complete search history.

(56) References Cited

U.S. PATENT DOCUMENTS
6,149,730 A * 11/2000 Matsubara et al. ............ 118/728
2004/0224090 A1* 11/2004 Krishnaraj et al. ...... 427/255.28

FOREIGN PATENT DOCUMENTS
| JP | 62-045122 A | 2/1987 |
| JP | 07-066180 A | 3/1995 |
| KR | 10-2007-0002252 A | 1/2007 |
| KR | 10-2008-0002957 A | 1/2008 |

OTHER PUBLICATIONS

International Search Report for International Patent Application No. PCT/KR2009/001464.

* cited by examiner

*Primary Examiner* — Jarrett Stark
(74) *Attorney, Agent, or Firm* — LRK Patent Law Firm

(57) ABSTRACT

Disclosed is a substrate processing apparatus and method. The substrate processing apparatus includes a chamber (10) providing an internal space, in which a process is carried out onto a substrate; a gas supply unit (40) supplying a source gas to the internal space; a coil (16) generating an electric field in the internal space to generate plasma from the source gas; and an adjustment ring (50) disposed on a flow path of the plasma toward a support member to adjust the flow of the plasma. The chamber (10) includes a process chamber (12), in which the support member is provided and the process is carried out by the plasma; and a generation chamber (14), in which the plasma is generated by the coil (16), provided on the upper surface of the process chamber (12), and the adjustment ring (50) is installed at the lower end of the generation chamber (14).

4 Claims, 3 Drawing Sheets

[Fig. 1]
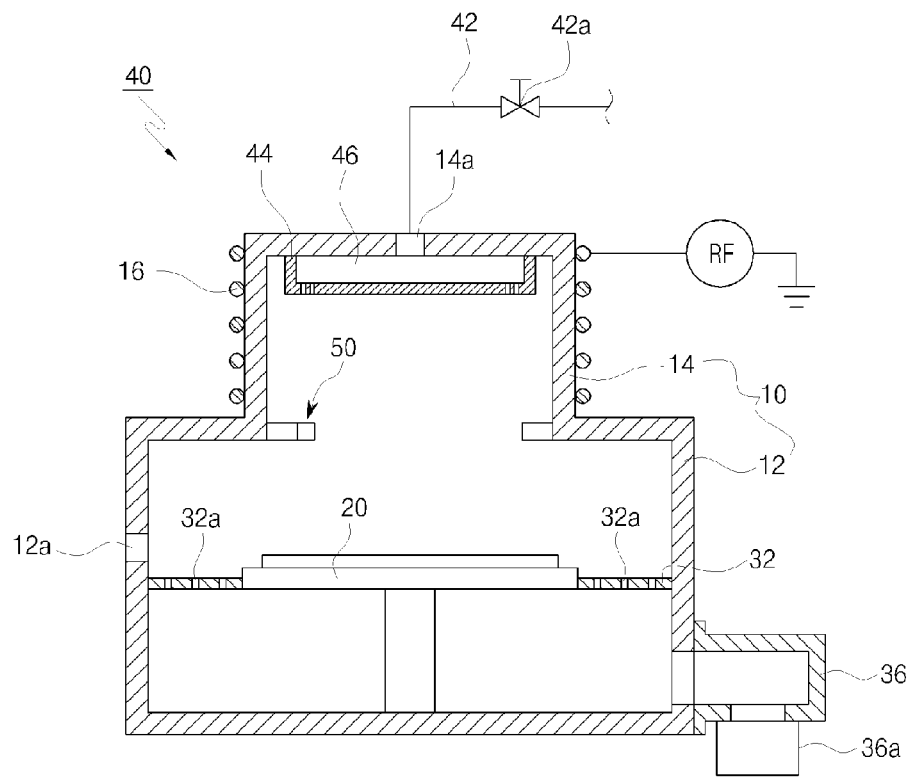
[Fig. 2]
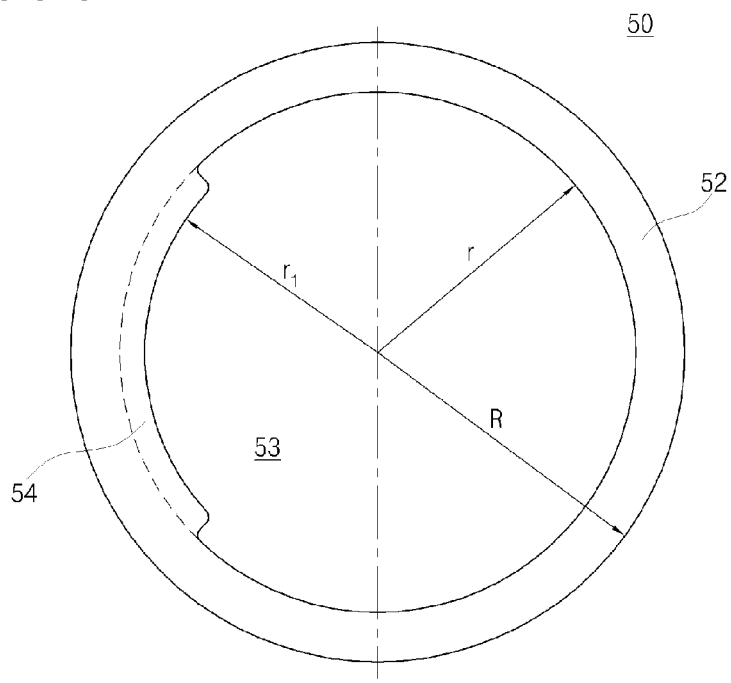

[Fig. 3]
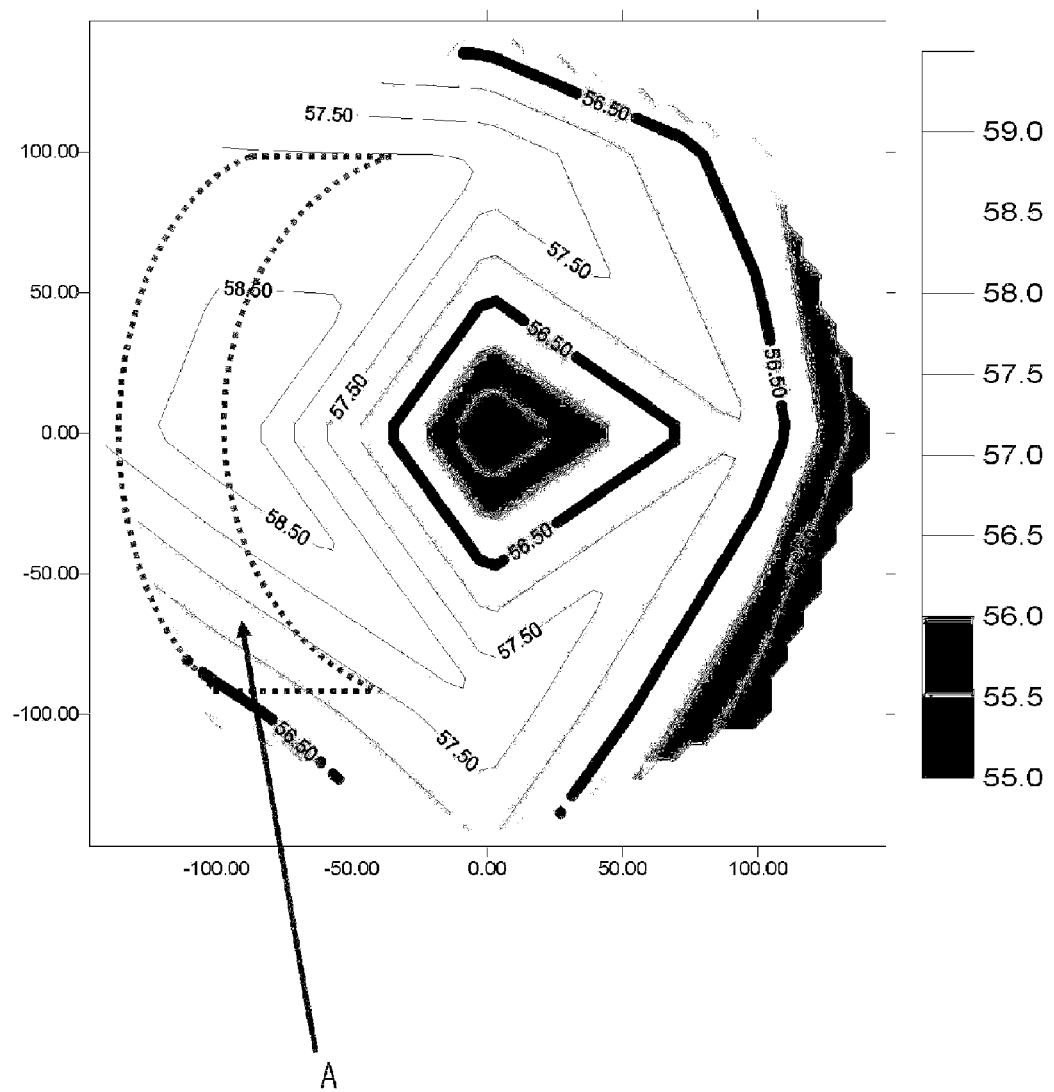
A

[Fig. 4]
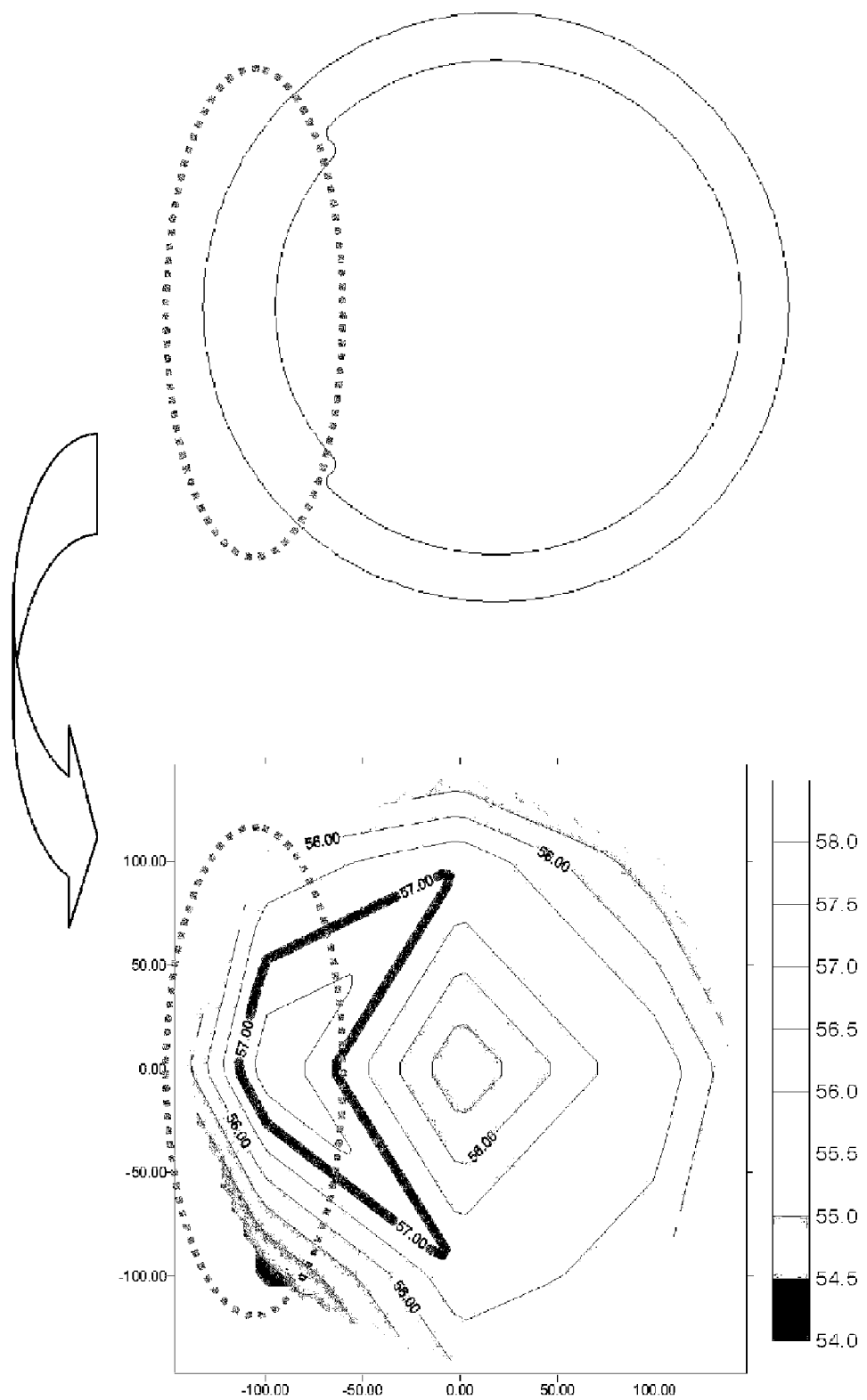

SUBSTRATE PROCESSING APPARATUS AND METHOD

TECHNICAL FIELD

The present invention relates to a substrate processing apparatus and method, and more particularly to a substrate processing apparatus and method, in which the flow of plasma is controllable.

BACKGROUND ART

A semiconductor device has many layers on a silicon substrate, and these layers are formed on the silicon substrate by a deposition process. Such a deposition process has several important issues, and these issues are essential to evaluation of deposited films and selection of deposition methods.

The first issue is the quality of deposited films. The quality means a composition, a contamination level, a defect density, and mechanical and electrical properties of the deposited films. The compositions of the films are varied according to deposition conditions, and are important to obtain a specific composition.

The second issue is the uniform thickness of the deposited films throughout a wafer. Particularly, the thickness of a film deposited on the upper surface of a nonplanar pattern having steps is important. Whether or not the thickness of the deposited film is uniform is determined through a step coverage, which is defined by a value obtained by dividing the minimum thickness of the film deposited on a stepped portion by the thickness of the film deposited on the upper surface of the pattern.

Another issue relating to deposition is space filling. This filling includes gap filling, in which gaps between metal lines are filled with an insulating film including an oxide film. The gaps are provided to physically and electrically insulate the metal lines from each other.

DISCLOSURE OF INVENTION

Technical Problem

Therefore, the present invention has been made in view of the above problems, and it is an object of the present invention to provide a substrate processing apparatus and method, in which process uniformity on the front surface of a substrate is increased.

It is another object of the present invention to provide a substrate processing apparatus and method, in which a film having a uniform thickness is deposited on a substrate.

It is a further object of the present invention to provide a substrate processing apparatus and method, in which the performance of a semiconductor device is improved.

Technical Solution

In accordance with an aspect of the present invention, the above and other objects can be accomplished by the provision of a substrate processing apparatus comprising a chamber providing an internal space, in which a process is carried out onto a substrate; a gas supply unit supplying a source gas to the internal space; a coil generating an electric field in the internal space to generate plasma from the source gas; and an adjustment ring disposed on a flow path of the plasma toward a support member to adjust the flow of the plasma.

The chamber may include a process chamber, in which the support member is provided and the process is carried out by the plasma; and a generation chamber, in which the plasma is generated by the coil, provided on the upper surface of the process chamber, and the adjustment ring may be installed at the lower end of the generation chamber.

The adjustment ring may include a ring plate, the outer circumferential surface of which contacts the inner wall surface of the chamber, provided with an opening formed through the center of the ring plate; and an interception plate installed at the opening to intercept the plasma moving through the opening.

The opening may have a first radius; and the interception plate may be formed in an arc shape having an outer diameter being approximately equal to the first radius and an inner diameter being smaller than the first radius.

The adjustment ring may include a ring plate, the outer circumferential surface of which contacts the inner wall surface of the chamber, provided with an opening formed through the center of the ring plate; and a plurality of interception plates installed at the opening to intercept the plasma moving through the opening.

In accordance with another aspect of the present invention, there is provided a substrate processing method, in which a substrate is processed using plasma, comprising selectively intercepting a flow path of the plasma toward the substrate.

Advantageous Effects

The substrate processing apparatus and method in accordance with the present invention increases process uniformity on the front surface of a substrate. Further, the substrate processing apparatus and method allows a film having a uniform thickness to be deposited on the substrate.

BRIEF DESCRIPTION OF DRAWINGS

The above and other objects, features and other advantages of the present invention will be more clearly understood from the following detailed description taken in conjunction with the accompanying drawings, in which:

FIG. 1 is a view schematically illustrating a substrate processing apparatus in accordance with the present invention;

FIG. 2 is a plan view illustrating an adjustment ring of FIG. 1;

FIG. 3 is a thickness distribution chart of a film illustrating a process result in case that the adjustment ring is not used; and FIG. 4 is a thickness distribution chart of a film illustrating a process result in case that the adjustment ring is used.

BEST MODE FOR CARRYING OUT THE INVENTION

Hereinafter, preferred embodiments of the present invention will be described in more detail with reference to FIGS. 1 to 4. The embodiments of the present invention may be variously modified, and the scope and spirit of the present invention is not limited to the embodiments, which will be described below. These embodiments are provided to those skilled in the art only for illustrative purposes. Therefore, shapes of respective elements shown in the drawings may be exaggerated for a better understanding of the present invention.

Although a deposition apparatus will be exemplarily described below, the present invention may be applied to various processes.

FIG. 1 is a view schematically illustrating a substrate processing apparatus in accordance with the present invention.

The substrate processing apparatus includes a chamber 10 providing an internal space, in which a process is carried out onto a substrate. The chamber 10 is divided into a process chamber 12 and a generation chamber 14. The process is carried out onto the substrate in the process chamber 12, and plasma is generated from a source gas supplied from a gas supply unit 40, which will be described later, in the generation chamber 14.

A support plate 20 is installed in the process chamber 12, and the substrate is mounted on the support plate 20. The substrate is put into the process chamber 12 through a gate 12a formed at one side of the process chamber 12, and the substrate put into the process chamber 12 is mounted on the support plate 20. Further, the support plate 20 may be an electrostatic chuck (E-chuck), and a separate helium (He) rear cooling system (not shown) to precisely control the temperature of a wafer mounted on the support plate 20 may be provided.

A coil 16 connected to an RF generator is provided on the outer surface of the generation chamber 14. When high frequency current flows in the coil 16, the current is converted into a magnetic field by the coil 16, and plasma is generated from the source gas supplied into the chamber 10 using the magnetic field.

A supply hole 14a is formed through the upper wall of the generation chamber 14, and a supply line 42 is connected to the supply hole 14a. The supply line 42 supplies the source gas to the inside of the chamber 10 through the supply hole 14a. The supply line 42 is opened and closed through a value 42a provided in the supply line 42. A diffusion plate 44 is connected to the upper wall of the generation chamber 14, and a buffering space 46 is formed between the diffusion plate 44 and the upper wall of the generation chamber 14. The source gas supplied through the supply line 42 fills the buffering space 46, and is diffused to the inside of the generation chamber 14 through diffusion holes formed through the diffusion plate 44.

An exhaust line 36 is connected to one side of the process chamber 12, and a pump 36a is connected to the exhaust line 36. The plasma and by-products generated in the chamber 10 are exhausted to the outside of the chamber 10 through the exhaust line 36, and the pump 36a serves to forcibly exhaust the plasma and the by-products. The plasma and the by-products in the chamber 10 are supplied to the exhaust line 36 through a plurality of exhaust holes 32a formed through an exhaust plate 32.

FIG. 2 is a plan view illustrating an adjustment ring 50 of FIG. 1. The substrate processing apparatus further includes the adjustment ring 50. The plasma is generated in the generation chamber 14, moves to the process chamber 12, and is supplied to the substrate mounted on the support plate 20 in the process chamber 12. Here, the adjustment ring 50 is installed at the lower end of the generation chamber 14 (or the upper end of the process chamber 12), and adjusts the flow of the plasma toward the process chamber 12.

As shown in FIG. 2, the adjustment ring 50 includes a ring plate 52, and an interception plate 54. The ring plate 52 has a ring shape having an outer diameter (radius=R), and an opening (radius=r) is formed through the center of the ring plate 52. The outer circumferential surface of the ring plate 52 is fixed to the inner wall surface of the chamber 10 (the lower end of the generation chamber 14 or the upper end of the process chamber 12).

The interception plate 54 is protruded from the inner surface of the ring plate 52 toward the center of the ring plate 52, and is installed at the opening of the ring plate 52. The interception plate 54 partially closes the opening of the ring plate 52, which is a flow path of the plasma, and thus partially blocks the flow of the plasma. It is preferable that the interception plate 54 has an arc shape having an outer diameter (radius=r), an inner diameter (radius=$r_1$), and a central angle, which is larger than 0° and smaller than 360°. In case that the central angle of the interception plate 54 is 0°, the interception plate 54 is not present, and the adjustment ring 50 is symmetric with respect to the center thereof and thus the plasma is symmetric with respect to the center of the adjustment ring 50. On the other hand, in case that the central angle of the interception plate 54 is 360°, the adjustment ring 50 is symmetric with respect to the center thereof and thus the plasma is symmetric with respect to the center of the adjustment ring 50. Therefore, in order to form the asymmetric flow of the plasma, it is preferable that the central angle of the interception plate 54 is set to be larger than 0° and smaller than 360°.

However, in case that the flow of the plasma is symmetric with respect to the center of the adjustment ring 50 (or the center of the substrate), there is a difference between the flow rate of plasma supplied to the central portion of the substrate and the flow rate of plasma supplied to the edge portion of the substrate, and thus process uniformity between the central portion and the edge portion of the substrate is improved through the above method. Therefore, the central angle of the adjustment ring 50 may be 0° (or) 360°.

FIG. 3 is a thickness distribution chart of a film illustrating a process result in case that the adjustment ring is not used, and FIG. 4 is a thickness distribution chart of a film illustrating a process result in case that the adjustment ring is used. In each of these drawings, a bar shown at the right side is a reference bar illustrating a brightness distribution according to the thickness of the film.

The distribution chart shown in FIG. 3 may be caused by various reasons. For example, the thickness distribution of the film, as shown in FIG. 3, may be obtained due to the non-uniformity of the temperature distribution of the support plate 20 (or the temperature characteristics of a heater (not shown) installed in the support plate 20). Here, in order to decrease the thickness of the film at a region A to improve the uniformity, the interception plate 54 is provided at a position corresponding to the region A. That is, as shown in FIG. 1, the adjustment ring 50 is installed on the inner wall surface of the chamber 10, and the adjustment ring 50 includes the interception plate 54 having a shape corresponding to the region A. The interception plate 54 blocks the flow of the plasma generated in the generation chamber 14, which moves toward the process chamber 12 (particularly, toward the region A). Therefore, the amount (or the density) of the plasma reaching the region A is reduced, and thereby the thickness of the film deposited at the region A can be decreased. As shown in FIG. 4, it was proven that the thickness of the film at the region corresponding to the interception plate 54 is decreased.

After the thickness distribution of the film without the adjustment ring 50 is measured, in order to decrease the thickness of the film at a specific region, the interception plate 54 corresponding to the specific region is processed by the above method, thereby being capable of decreasing the thickness of the film at the specific region and improving the uniformity of the film. In case that the above method is repeatedly carried out, the uniformity of the film can be highly improved. Further, a plurality of specific regions may be present, and thereby a plurality of interception plates 54 may be used.

Although this embodiment illustrates the interception plate 54 having an arc shape, since the shape of the interception plate 54 is determined by the shape of the above-described specific region (for example, the region A), the interception plate 54 may have various shapes.

Industrial Applicability

The substrate processing apparatus and method in accordance with the present invention increases process uniformity on the front surface of a substrate. Further, the substrate processing apparatus and method allows a film having a uniform thickness to be deposited on the substrate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A substrate processing apparatus comprising:
a chamber providing an internal space, in which a process is carried out onto a substrate;
a gas supply unit supplying a source gas to the internal space;
a coil generating an electric field in the internal space to generate plasma from the source gas; and
an adjustment ring disposed on a flow path of the plasma toward a support member to adjust the flow of the plasma,
wherein the adjustment ring includes:
a ring plate, the outer circumferential surface of which contacts the inner wall surface of the chamber, provided with an opening formed through the center of the ring plate; and
an interception plate installed at the opening to intercept the plasma moving through the opening.

2. The apparatus according to claim 1, wherein the chamber includes:
a process chamber, in which the support member is provided and the process is carried out by the plasma; and
a generation chamber, in which the plasma is generated by the coil, provided on the upper surface of the process chamber; and
the adjustment ring is installed at the lower end of the generation chamber.

3. The apparatus according to claim 1, wherein:
the opening has a first radius; and
the interception plate is formed in an arc shape having an outer diameter being approximately equal to the first radius, an inner diameter being smaller than the first radius, and a central angle being larger than 0° and smaller than 360°.

4. A substrate processing apparatus comprising:
a chamber providing an internal space, in which a process is carried out onto a substrate;
a gas supply unit supplying a source gas to the internal space;
a coil generating an electric field in the internal space to generate plasma from the source gas; and
an adjustment ring disposed on a flow path of the plasma toward a support member to adjust the flow of the plasma,
wherein the adjustment ring includes:
a ring plate, the outer circumferential surface of which contacts the inner wall surface of the chamber, provided with an opening formed through the center of the ring plate; and
a plurality of interception plates installed at the opening to intercept the plasma moving through the opening.

* * * * *